(12) United States Patent
Joshi et al.

(10) Patent No.: US 10,560,047 B2
(45) Date of Patent: Feb. 11, 2020

(54) METHOD AND APPARATUS FOR PREDICTING DEGRADATION IN POWER MODULES

(71) Applicant: TOYOTA MOTOR ENGINEERING & MANUFACTURING NORTH AMERICA, INC., Erlanger, KY (US)

(72) Inventors: Shailesh N. Joshi, Ann Arbor, MI (US); Ercan M. Dede, Ann Arbor, MI (US)

(73) Assignee: TOYOTA MOTOR ENGINEERING & MANUFACTURING NORTH AMERICA, INC., Erlanger (DE)

( * ) Notice: Subject to any disclaimer, the term of this patent is extended or adjusted under 35 U.S.C. 154(b) by 296 days.

(21) Appl. No.: 15/730,282

(22) Filed: Oct. 11, 2017

(65) Prior Publication Data

US 2019/0109556 A1 Apr. 11, 2019

(51) Int. Cl.
*G01R 31/28* (2006.01)
*H02P 29/024* (2016.01)

(52) U.S. Cl.
CPC .......... *H02P 29/024* (2013.01); *G01R 31/281* (2013.01)

(58) Field of Classification Search
CPC ............ G01R 31/2874; G01R 31/2875; G01R 31/2877
See application file for complete search history.

(56) References Cited

U.S. PATENT DOCUMENTS

| | | |
|---|---|---|
| 7,330,046 B2 | 2/2008 | Dürbaum |
| 9,435,866 B2 | 9/2016 | Takahashi et al. |
| 2012/0039045 A1 | 2/2012 | Yin et al. |
| 2013/0158763 A1 | 6/2013 | Yuhara et al. |
| 2014/0330461 A1* | 11/2014 | Ueno ................ B61C 17/00 701/19 |
| 2015/0120226 A1* | 4/2015 | Tanabe ............. G01R 31/3648 702/63 |
| 2016/0264013 A1 | 9/2016 | Kim |
| 2017/0003337 A1 | 1/2017 | Bito et al. |
| 2017/0187358 A1 | 6/2017 | Takeuchi et al. |

FOREIGN PATENT DOCUMENTS

WO WO 2013/187207 A1 12/2013

OTHER PUBLICATIONS

"T3Ster®—Fast and accurate thermal test measurement and characterization of IC packages, LEDs and systems", Mentor Graphics. https://www.mentor.com/products/mechanical/micred/t3ster/, Oct. 11, 2017, 6 pages.
"How to Measure Thermal Resistance of LED Emitters and LED Arrays", LUMILEDS, 2016, 10 pages.

* cited by examiner

*Primary Examiner* — Tung X Nguyen
(74) *Attorney, Agent, or Firm* — Oblon, McClelland, Maier & Neustadt, L.L.P.

(57) ABSTRACT

A system, computer readable medium, and a method for monitoring power module degradation in a vehicle are provided. The method includes determining a structure function of a power module, determining a change in the structure function based on a comparison between the structure function and an initial or baseline structure function associated with the power module, outputting a degradation determination result based on the change in the structure function, and generating an alert when the degradation determination result exceeds a predetermined or adaptively determined degradation criterion value.

20 Claims, 6 Drawing Sheets

METHOD AND APPARATUS FOR PREDICTING DEGRADATION IN POWER MODULES

BACKGROUND

Power modules installed in electric vehicles may experience degradation in one or more layers of the power modules. A fault during an operation of the power module may have adverse results. U.S. Publication No. 2017/0003337 entitled "Semiconductor device and fault detection method" by Bito et al. describes a method for detecting fault in a semiconductor device based on thermal resistance.

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention.

SUMMARY

The present disclosure relates to a method for monitoring power module degradation in a vehicle that determines a structure function of a power module, determines a change in the structure function based on a comparison between the structure function and an initial structure function associated with the power module, outputs a degradation determination result based on the change in the structure function, and generates an alert when the degradation determination result exceeds a predetermined degradation criterion value.

The present disclosure also relates to a system for monitoring power module degradation in a vehicle. The system includes a power module and processing circuitry. The processing circuitry is configured to determine a structure function of a power module, determine a change in the structure function based on a comparison between the structure function and an initial structure function associated with the power module, output a degradation determination result based on the change in the structure function, and generate an alert when the degradation determination result exceeds a predetermined degradation criterion value.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program" or "computer program" or similar terms, as used herein, is defined as a sequence of instructions designed for execution on a computer system. A "program", or "computer program", may include a subroutine, a program module, a script, a function, a procedure, an object method, an object implementation, in an executable application, an applet, a servlet, a source code, an object code, a shared library/dynamic load library and/or other sequence of instructions designed for execution on a computer system.

Reference throughout this document to "one embodiment", "certain embodiments", "an embodiment", "an implementation", "an example" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A: B; C; A and B; A and C; B and C; A, B and C". An exception to this definition will occur only when a combination of elements, functions, steps or acts are in some way inherently mutually exclusive.

Referring now to the drawings, wherein like reference numerals designate identical or corresponding parts throughout several views, the following description relates to a system and associated methodology for monitoring and detecting faults in a power module (e.g., semiconductor device).

A diagnostic model to predict degradation of power modules installed in electric vehicles is described herein. Specifically, a change in a structure function associated with the power module is correlated to the degradation of the power module.

Conventionally, the reliability of, power modules subjected to power cycling is determined by using numerical and/or analytical techniques (e.g., Weibull plots). A structure function approach may be used to determine degradation of the power modules (e.g., a crack or degradation of the device solder bond layer). By analyzing the changes in the structure function before and after power cycling, possible degradation regions can be understood and detected as described further below.

Figure 1:
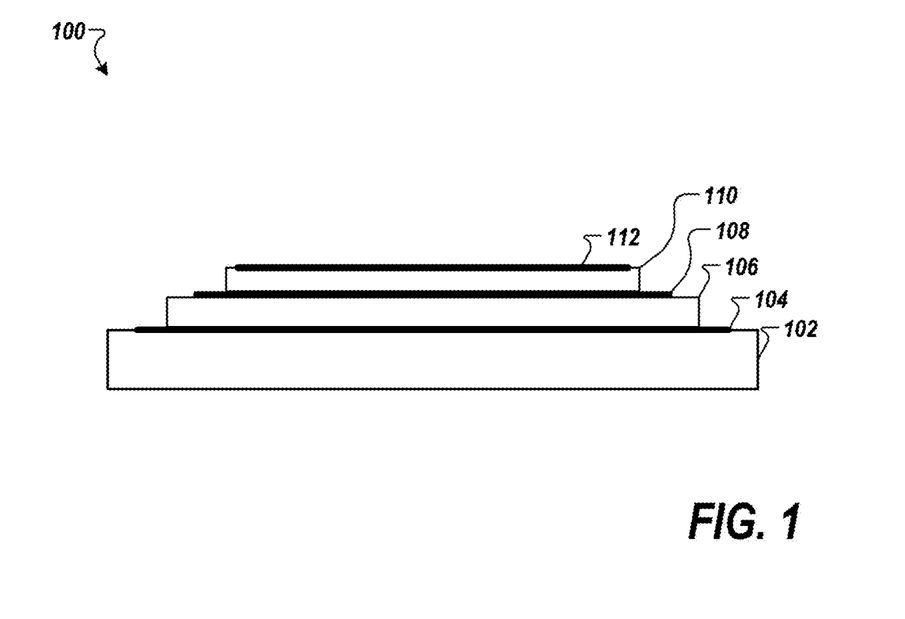
FIG. 1 is a schematic that shows a power module according to one example.

FIG. 1 is a schematic that shows a power module 100 according to one example. The power module 100 includes a cold plate 102, a base plate 106, a chip 110, and further electrical connections (e.g., lead frame or wire bonds) that are not shown. The cold plate 102 is connected to the base plate 106 via a grease layer 104 or may be bonded using a sintering or solder attachment technique. The base plate 106 (e.g., substrate) may be configured to have at least the chip 110 coupled to the base plate 106. The base plate 106 may include an aluminum nitride layer and a copper layer. In one implementation, the chip 110 is coupled to the base plate 106 via a die attach layer 108. A junction 112 is formed on the chip 110. The words "over" and "on" used with regard to a material layer formed or located "over" or "on' a surface may include the material layer may be located (e.g., formed, deposited) "directly on" or "indirectly on" the surface (e.g., one or more additional layer being arranged between the surface and the material layer. In one implementation, the cold plate 102 may include a single channel. In other implementations, the cold plate 102 may include a plurality of channels designed to remove heat from the electronics package.

Figure 2:
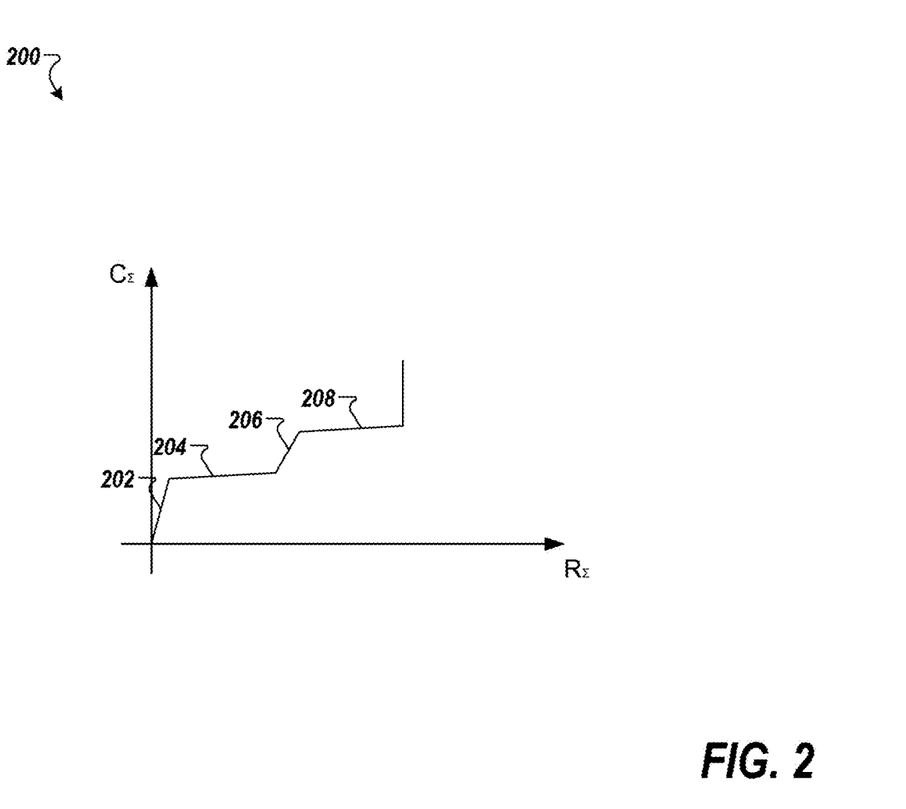
FIG. 2 is a schematic that shows a structure function according to one example.

FIG. 2 is a schematic that shows a structure function 200 according to one example. The structure function 200 is a graph of thermal capacitance (C) versus thermal resistance (R) of each layer of the power module 100. The thermal resistance is a function of change in device temperature and electrical power applied. The thermal capacitance and the thermal resistance may be a function of the thickness of each layer (e.g., chip, cold plate) and the property of that layer. To determine the structure function 200 of the power module 100, a K-factor (i.e., calibration factor) is determined by heating the power module 100 to fixed temperatures (e.g., 30° C., 45° C., 90° C.) and measuring a device voltage using a small sense current (e.g., 1/50 of a nominal device current) for each of the aforementioned temperature values. Once the K-factor is known, power is applied to the power module 100 until a steady state package temperature is reached. Then, the power module 100 is turned off and the device voltage is measured via the sense current as the power module 100 cools down. A thermal impedance associated with the power module 100 is determined as a function of the K-factor and the temperature versus time response. Then, using a series of deconvolutions and derivations, the structure function is determined. Section 202 of the structure function 200 may be associated with the chip 110. Section 204 may be associated with the die attach layer 108. Section 206 may be associated with the base plate 106. Section 208 may be associated with the grease layer 104.

Depending upon the degradation of the layers of the power module 100, the structure function 200 may deviate from a measured baseline curve. The baseline curve may be an initial structure function determined before the power module being, used (i.e., before power cycling). For example, the baseline curve for a power module installed in an electric vehicle may be measured when the vehicle is first put in service or when a new power module is installed in the vehicle. Typically, the structure function may be used to understand reliability of the power module 100 under ideal test conditions and changes that occur due to controlled thermal or power cycling.

Figure 3A:
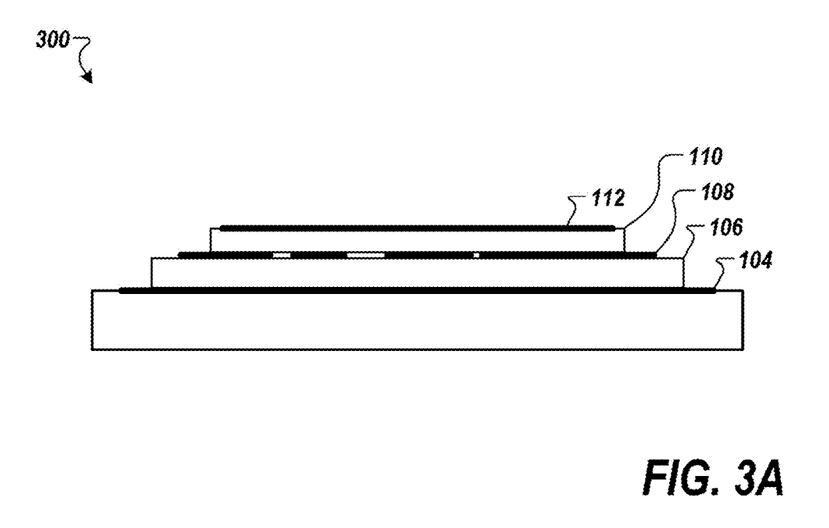
FIG. 3A is a schematic that shows the power module in a degraded state according to one example.

FIG. 3A is a schematic 300 that shows the power module in a degraded state according to one example. The die attach layer 108 that couples the chip 110 to the base plate 106 is degraded through the introduction of voiding or cracking due to thermal or power cycling of the electronics.

Figure 3B:
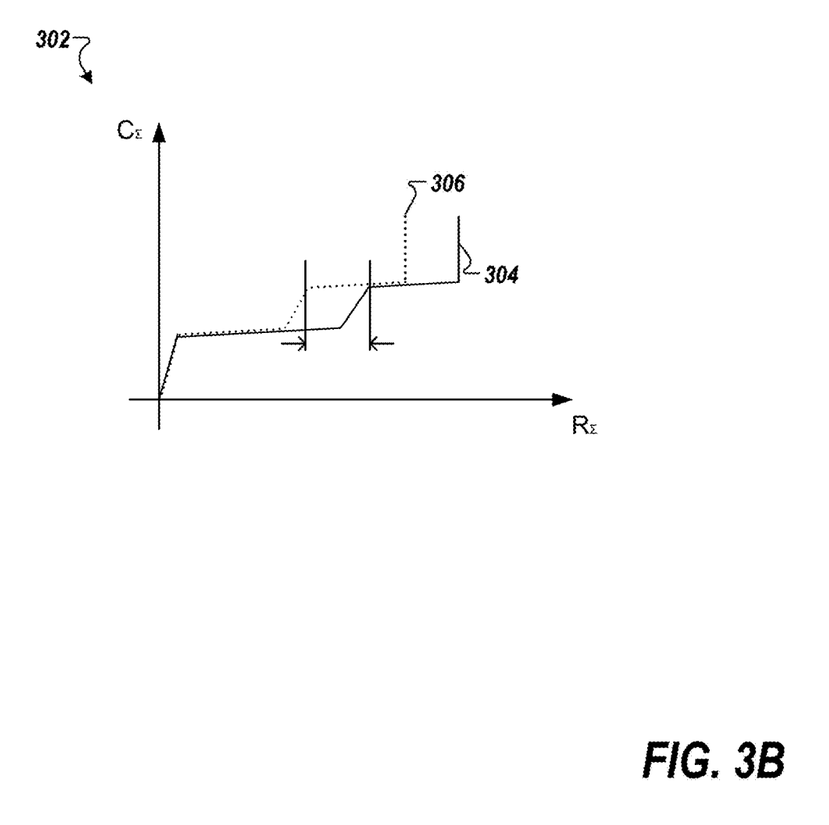
FIG. 3B is a schematic that shows the structure function of the power module in the degraded state according to one example.

FIG. 3B is a schematic 302 that shows the structure function of the power module in the degraded state according to one example. The structure function 304 associated with the power module is shifted with respect to the baseline structure function 306 associated with the power module in non-degraded state of FIG. 1. The change in section 204 associated with the die attach layer 108 of the structure function may indicate degradation of the die attach layer 108 such as existence of voids in the die attach layer 108.

Figure 4:
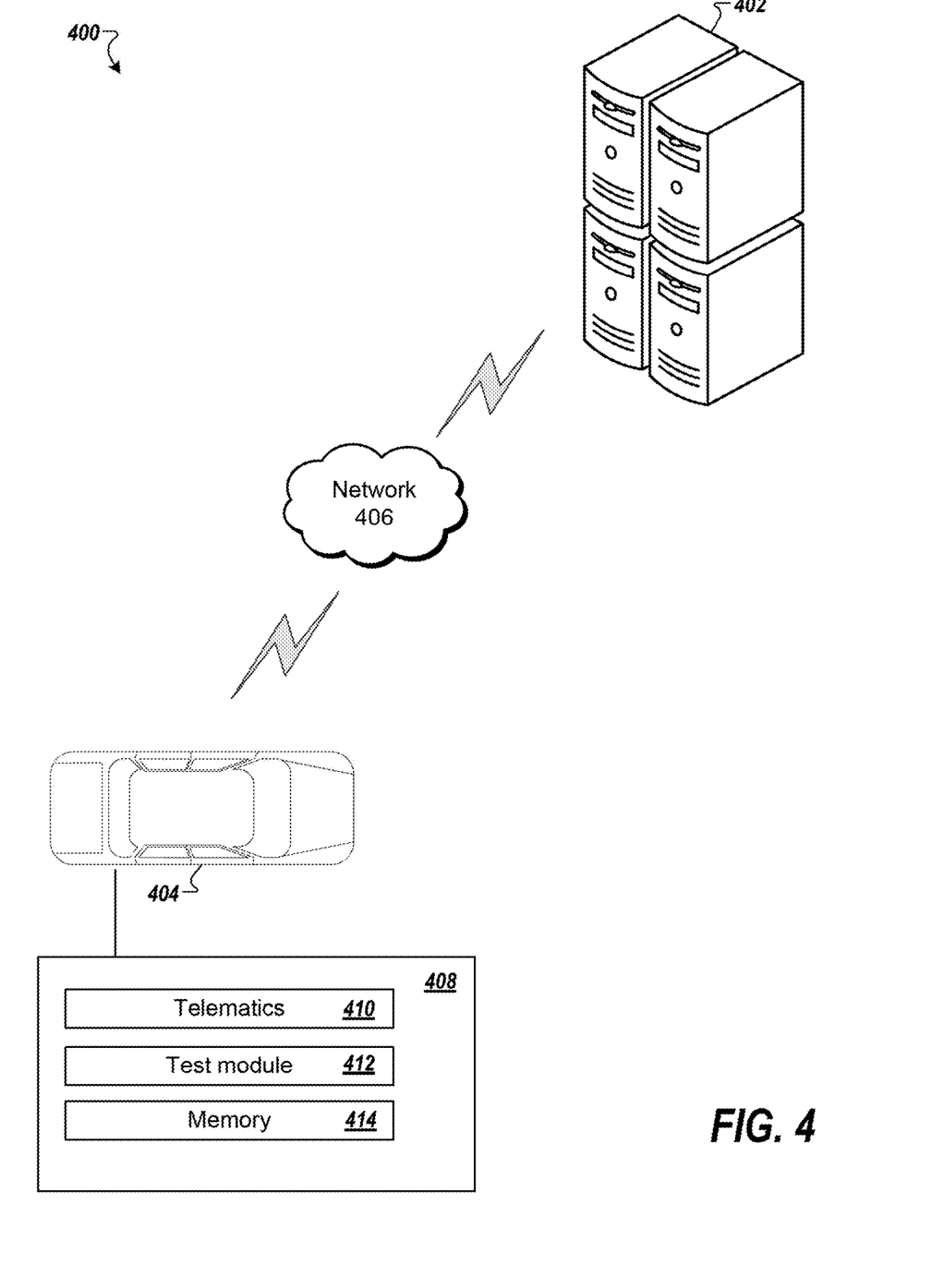
FIG. 4 is a block diagram of a system for predicting degradation in the power module according to one example.

FIG. 4 is a schematic that shows a system 400 for monitoring and detecting degradation in power modules associated with one or more vehicles 404 according to one example. The system 400 may include one or more servers 402 or other computing resources, which can include cloud computing resources. The system 400 may also include a network 406. The vehicle 404 may communicate with the server 402 via the network 406. The vehicle 404 may include an ECU (Electronic control unit) 408. The ECU 408 may include a telematics module 410, a test module 412, and a memory 414.

A structure function for a power module inside an electric vehicle 404 may be generated and used as a baseline. The baseline may be stored in the memory 414 of the ECU 408. Later, under various scenarios (e.g., parking, during charging of the vehicle, during maintenance) additional power module structure functions are obtained by turning on the MOSFET (Metal oxide semiconductor field effect transistor) or similar power device. If degradation is seen in the power module, the structure function may change as shown in FIG. 3B. The comparison of the two structure functions is used to make an assessment to service the power module, or not. For example, in response to the car mileage reaching 5,000 miles, 10,000 miles, or the like, a new structure function is determined by the test module 412 and stored in the memory 414 or uploaded to the server 402. The structure function may change (e.g., shift horizontally or vertically) due to thermal resistance or thermal capacitance degradation in the various layers of the power module 100.

In one implementation, the ECU 408 analyzes the change in the structure function to detect any reliability issues or degradation prior to a severe event actually occurring. The ECU 408 or other on-board computer may be used to perform the structure function test and data post-processing in an automated fashion on-board the vehicle 404. The data may then be uploaded to a database of the server 402 via the telematics module 410 for lifetime history, as desired. The server 402 may receive the structure function from one or more vehicles 404 via the network 406. The server 402 may store an association between the structure function and the vehicle using a vehicle identification number associated with the vehicle. Assessment of structure function changes can be done either on-board, during vehicle servicing, or off-line (cloud computing or server 402) when the vehicle is not under maintenance.

The modules described herein may be implemented as either software and/or hardware modules and may be stored in any type of computer-readable medium or other computer storage device. For example, each of the modules described herein may be implemented in circuitry that is programmable (e.g., microprocessor-based circuits) or dedicated circuits such as ASICS (application specific integrated circuits) or FPGAS (field programmable gate arrays). In one embodiment, a CPU (central processing unit) could execute software to perform the functions attributable to each of the modules described herein. The CPU may execute software instructions written in a programing language such as Java, C, or assembly. One or more software instructions in the modules may be embedded in firmware, such as an erasable programmable read-only memory (EPROM).

The network 406 is any network that allows the server 402 and the vehicle 404 to communicate information with each other. Suitable networks Can include or interface with any one or more of a local intranet, a PAN (Personal Area Network), a LAN (Local Area Network), a WAN (Wide Area Network), a MAN (Metropolitan Area Network), a VPN (Virtual Private Network), or a SAN (storage area network). Furthermore, communications may also include links to any of a variety of wireless networks, including WAP (Wireless Application Protocol), GPRS (General Packet Radio Service), GSM (Global system for Mobile Communication), CDMA (Code Division Multiple Access) or TDMA (Time Division Multiple Access), cellular phone networks, GPS (Global Positioning System), CDPD (Cellular digit packet data), Bluetooth radio, or an IEEE 802.11 based radio frequency.

As described previously herein, a structure function analysis approach may be used for the interrogation of power electronic assemblies having semiconductor devices bonded to chip-scale integrated fluid channel systems for embedded cooling of the power device. The structure function based method to predict degradation of a power module subjected to real-world drive cycle conditions is described next.

Figure 5:
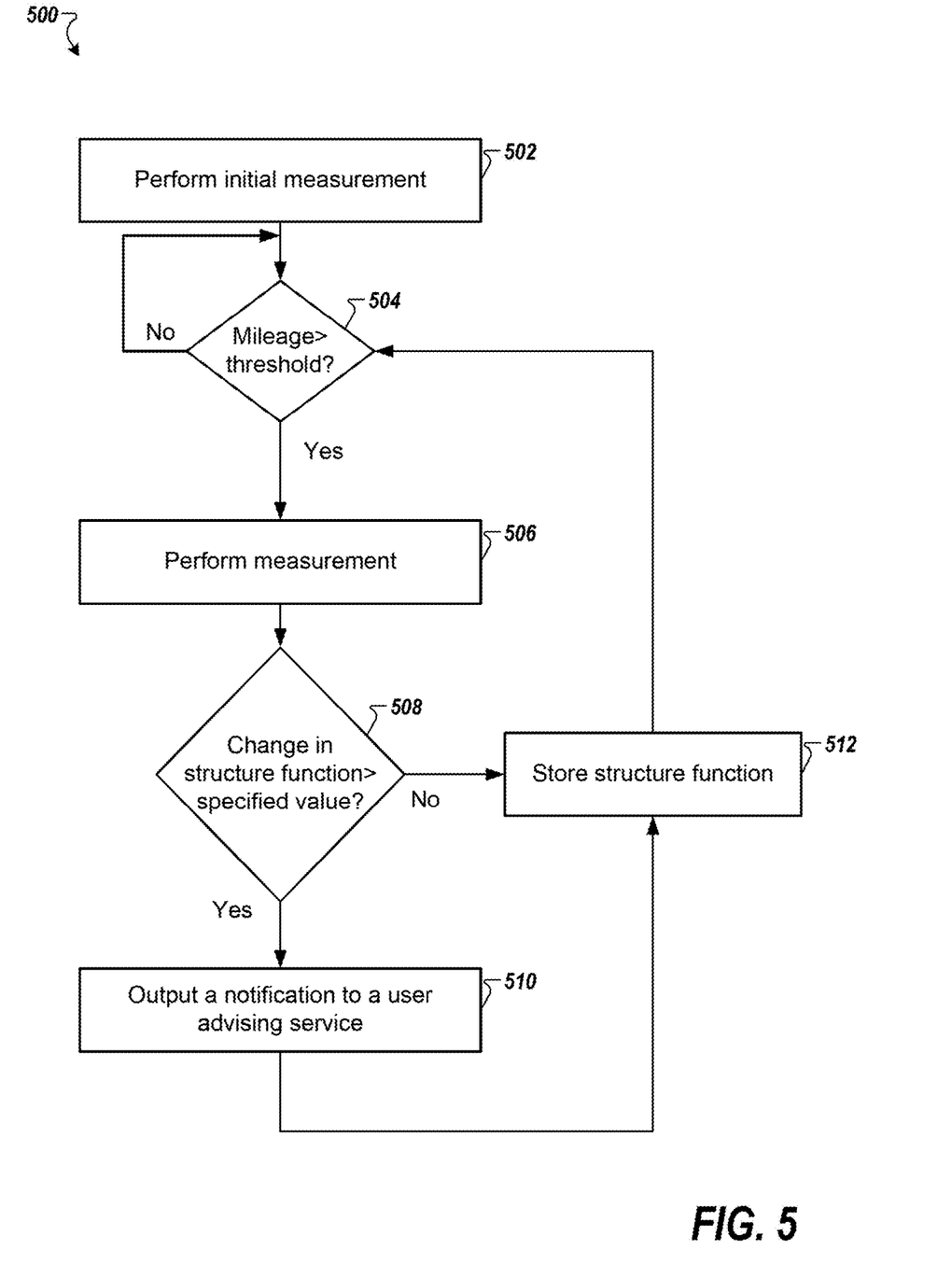
FIG. 5 is a flowchart that shows a fault detection and monitoring process according to one example.

FIG. 5 is a flowchart that shows a fault detection and monitoring process 500 according to one example. At step 502, a baseline structure function (i.e., initial structure function) of the power module is generated by applying power to a device (associated with the power module), activating the device for a predetermined period (e.g., about 60 seconds), and deactivating, the device.

At step 504, the ECU 408 may check to see whether the vehicle has accumulated a predetermined mileage (e.g., 5,000, 10,000 miles). In response to determining that the vehicle has accumulated the predetermined mileage, the process proceeds to step 506.

At step 506, The ECU 408 may generate an instruction to the user to park the vehicle 404 and turn off the engine of the vehicle 404. Once the ECU 408 determines that the vehicle 404 is in a parked state. The structure function is generated in the ECU 408 or remotely in the server 402 as described previously herein. In one implementation, once the predetermined mileage has been reached, the structure function may be generated once the vehicle 404 is serviced during maintenance. In one implementation, the server 402 may prompt the ECU 408 to upload structure function data to the server 402.

At step 508, the ECU 408 can determine a deviation between the baseline and the current structure function. The deviation is correlated to the degradation state of the power module. For example, a deviation less than 30% may indicate the start of the degradation of the power module. Once the deviation reaches a predetermined or adaptively determined degradation criterion value (e.g., 70% or 80%), an alert may be generated at step 510 by the ECU 408. In one implementation, the ECU 408 may output a notification indicating the estimated remaining useful life.

In one implementation, the ECU 408 may control one or more systems of the vehicle 404 in order to maximize a life of the power module when the degradation determination result exceeds the predetermined or adaptively determined degradation criterion value. For example, the ECU 408 may deactivate one or more non-essential systems.

At step 512, the structure function may be updated in the memory. Each subsequent structure function may be stored in the server 402. In one implementation, the baseline and the most recent structure function are stored in the memory 414 of the ECU 408 and/or the server 402.

The method described herein is suitable for any electronics package irrespective of the electrified vehicle power module architecture. In addition, the method described herein may be used to determine the degradation state to any electronics package that includes diodes or other semiconductor devices (e.g., insulated gate bipolar transistor (IGBT)).

Although the flow charts show specific orders of executing functional logic blocks, the order of executing the block blocks may be changed relative to the order shown, as will be understood by one of ordinary skill in the art. Also, two or more blocks shown in succession may be executed concurrently or with partial concurrence.

Figure 6A:
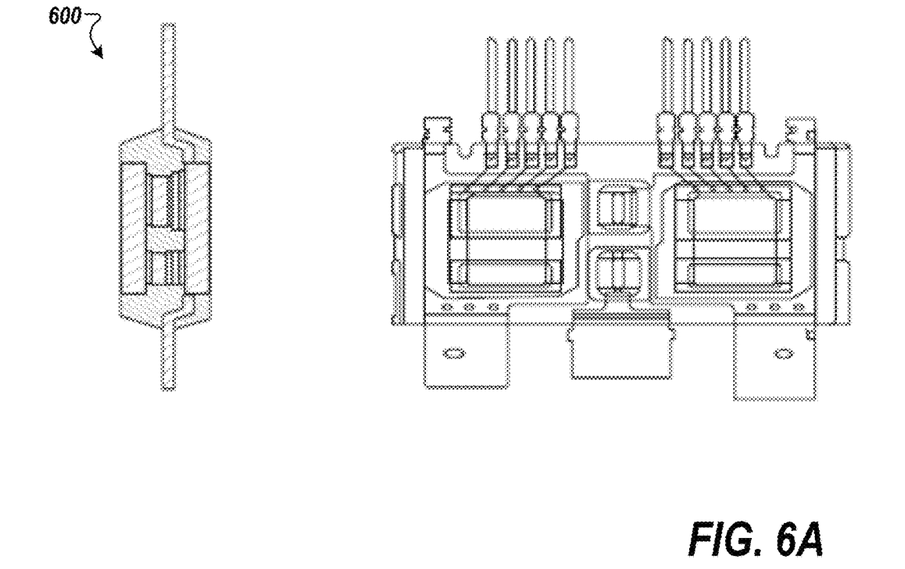
FIG. 6A is a schematic that shows a power card according to one example.

FIG. 6A is a schematic that shows a power card 600 according to one example. The structure function described herein may be used to analyze degradation in the package bond layers or electrical connections. The power card 600 may be attached to a separate heat sink or a cold plate with thermal grease interposed.

Figure 6B:
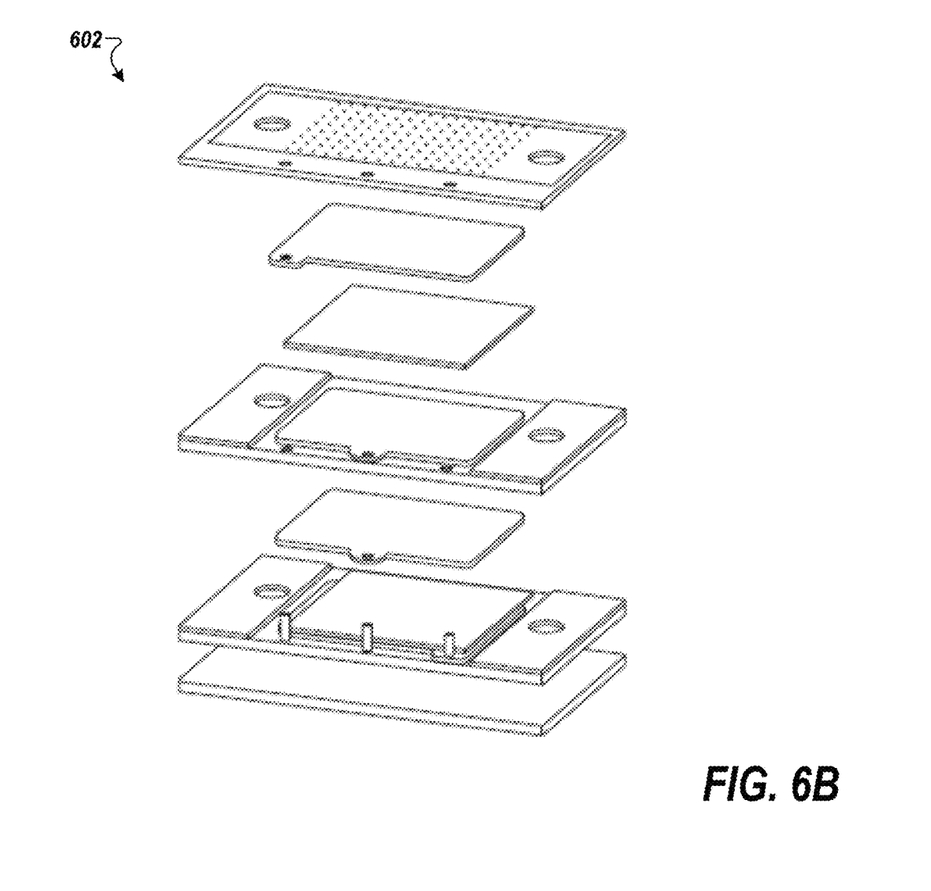
FIG. 6B is a schematic that shows a chip-scale module with integrated near junction chip-scale cooling structure according to one example.

FIG. 6B is a schematic that shows a chip-scale module 602 with integrated/embedded near junction chip-scale cooling structure according to one example. The chip-scale module 602 may be Si wafer based. The structure function described herein may be applied to detect whether there is any anomaly at the embedded cooler level. For example, if there is any erosion or blockage (e.g., in microchannels) at the cooler level the cooling performance may change which in turn may change the structure function.

Thus, the method described herein may be applied to analyze the internal structure of the device or the package. Further, the cooling performance over time may be analyzed. The power module may have double sided cooling or single sided cooling (i.e., planar cooling structure). In single sided cooling, the heat flow through the package is typically unidirectional. In one implementation, for the double sided cooling (e.g., power card, chip-scale module package) the method may include separating the thermal resistances and capacitances of the parallel heat flow paths (i.e., top and bottom of the device). For example, a numerical or equation based model of the system might provide such insight for easy deconvolution of the structure function of parallel heat flow paths.

In one implementation, the functions and processes of the ESD 408 may be implemented by the server 402. Next, a hardware description of the server 402 according to exemplary embodiments is described. The server 402 includes a CPU which performs the processes described herein and the process data and instructions may be stored in memory. These processes and instructions may also be stored on a storage medium disk such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the controller communicates, such as a server or computer.

Further, the claimed advancements may be provided as a utility application, background daemon, or component of an operating system, or combination thereof, executing in conjunction with CPU and an operating system such as Microsoft Windows, UNIX, Solaris, LINUX, Apple MAC-OS and other systems known to those skilled in the art.

In order to achieve the server 402, the hardware elements may be realized by various circuitry elements, known to those skilled in the art. For example, CPU may be a Xenon or Core processor from Intel of America or an Opteron processor from AMD of America, or may be other processor types that would be recognized by one of ordinary skill in the art. Alternatively, the CPU may be implemented on an FPGA, ASIC, PLD or using discrete logic circuits, as one of ordinary skill in the art would recognize. Further, CPU may be implemented as multiple processors cooperatively working in parallel to perform the instructions of the inventive processes described above.

A description of the general features and functionality of the display, as well as the display controller, storage controller, network controller, and general purpose I/O interface is omitted herein for brevity as these features are known.

The methodologies described herein may be implemented in a vehicle environment. For example, the vehicle environment may include a vehicle. The vehicle may include one or more sensors, one or more actuators, one or more control units, one or more media systems, one or more displays, one or more routers, one or more antennas, and one or more on board computers. The one or more on board computers may be configured to perform the method for monitoring power module degradation in the vehicle described herein.

The features of the present disclosure provide a multitude of improvements in the technical field of power module prognostics and reliability monitoring. In particular, the ECU 408 identifies monitors one or more power modules associated with a vehicle. The methodology described herein increases the safety of the devices that include power modules.

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A method for monitoring power module degradation in a vehicle, comprising:
   determining, using processing circuitry, a structure function of a power module, the structure function being representative of, a thermal capacitance and a thermal resistance of the power module;
   determining, using the processing circuitry, a change in the structure function based on a comparison between the structure function and an initial structure function associated with the power module;
   outputting a degradation determination result based on the change in the structure function; and
   generating an alert when the degradation determination result exceeds a degradation criterion value.

2. The method of claim 1, further comprising:
   controlling one or more systems of the vehicle associated with the power module to maximize a life of the power module when the degradation determination result exceeds the degradation criterion value.

3. The method of claim 1, further comprising:
   determining the initial structure function of the power module when the power module is initially put into service.

4. The method of claim 1, wherein the structure function is determined when the vehicle has accumulated a predetermined mileage.

5. The method of claim 1, wherein the power module includes a plurality of layers and a change in a first section of the structure function is associated with degradation in a first layer of the power module.

6. The method of claim 1, wherein h structure function change is associated with a shift in a horizontal direction or a vertical direction.

7. The method of claim 1, wherein the power module incorporates a planar cooling structure.

8. The method of claim 1, wherein the power module incorporates a double sided cooling structure.

9. A system for monitoring power module degradation in a vehicle, comprising
   a power module; and
   processing circuitry configured to
      determine a structure function of a power module, the structure function being representative of a thermal capacitance and a thermal resistance of the power module,
      determine a change in the structure function based on a comparison between the structure function and an initial structure function associated with the power module,
      output a degradation determination result based on the change in the structure function, and
      generate an alert when the degradation determination result exceeds a degradation criterion value.

10. The system of claim 9, wherein the processing circuitry is further configured to:
    control one or more systems associated with the power module to maximize a life of the power module when the degradation determination result exceeds the degradation criterion value.

11. The system of claim 9, wherein the processing circuitry is further configured to:
    determine the initial structure function of the power module when the power module is initially put into service.

12. The system of claim 9, wherein the structure function is determined when the vehicle has accumulated a predetermined mileage.

13. The system of claim 9, wherein the power module includes a plurality of bonded or attached layers and a change in a first section of the structure function is associated with degradation in a first layer of the power module.

14. The system of claim 9, wherein the structure function change is associated with a shift in a horizontal direction or a vertical direction.

15. The system of claim 9, wherein the power module incorporates a planar cooling structure.

16. The system of claim 9, wherein the power module incorporates a double sided cooling structure.

17. The system of claim 9, wherein the processing circuitry is further configured to:
    prompt processing circuitry associated with the vehicle to upload structure function data to a server.

18. The system of claim 9, wherein the degradation criterion value is 70%.

19. The system of claim 9, wherein the degradation criterion value is adaptively determined.

20. A non-transitory computer readable medium storing computer-readable instructions therein which when executed by a computer cause the computer to perform a method for monitoring power module degradation, the method comprising:
- determining a structure function of a power module, the structure function being representative of a thermal capacitance and a thermal resistance of the power module;
- determining a change in the structure function based on a comparison between the structure function and an initial structure function associated with the power module;
- outputting a degradation determination result based on the change in the structure function; and
- generating an alert when the degradation determination result exceeds a predetermined degradation criterion value.

* * * * *